US010228393B2

(12) United States Patent
Tierney et al.

(10) Patent No.: US 10,228,393 B2
(45) Date of Patent: Mar. 12, 2019

(54) SLIDE CLOSURE MULTI TESTER

(71) Applicant: Universal Enterprises, Inc., Beaverton, OR (US)

(72) Inventors: Sean Patrick Tierney, Milwaukie, OR (US); David Lauren Wheaton, Sherwood, OR (US); Michael John Kane, Portland, OR (US)

(73) Assignee: Kane USA, Inc., Beaverton, OR (US)

( * ) Notice: Subject to any disclaimer, the term of this patent is extended or adjusted under 35 U.S.C. 154(b) by 163 days.

(21) Appl. No.: 15/786,589

(22) Filed: Oct. 17, 2017

(65) Prior Publication Data

US 2018/0038893 A1   Feb. 8, 2018

Related U.S. Application Data

(63) Continuation-in-part of application No. 15/044,093, filed on Feb. 15, 2016, now Pat. No. 9,791,479.

(51) Int. Cl.

| | |
|---|---|
| *G01R 33/36* | (2006.01) |
| *G01R 1/067* | (2006.01) |
| *G01R 15/12* | (2006.01) |
| *G01R 15/18* | (2006.01) |
| *G01R 19/00* | (2006.01) |
| *G01R 13/02* | (2006.01) |

(52) U.S. Cl.
CPC ......... *G01R 1/06788* (2013.01); *G01R 15/12* (2013.01); *G01R 15/186* (2013.01); *G01R 19/0092* (2013.01); *G01R 13/0245* (2013.01)

(58) Field of Classification Search
CPC ...... G01R 19/14; G01R 1/04; G01R 19/0092; G01R 31/362; G01R 31/3606; G01R 31/3679; G01R 1/203; G01R 15/18; G01R 15/181; G01R 15/183
USPC ... 324/127, 156, 116, 121 R, 72.5, 117, 133, 324/129, 117 R, 126, 114, 115, 149, 378, 324/429, 426, 143

See application file for complete search history.

(56) References Cited

U.S. PATENT DOCUMENTS

| | | | |
|---|---|---|---|
| 2,783,437 A | 2/1957 | Yenni et al. | |
| 2,834,941 A | 5/1958 | Hickok, Jr. et al. | |
| 3,840,808 A * | 10/1974 | Liebermann | G01R 1/22 324/127 |

(Continued)

*Primary Examiner* — Patrick Assouad
*Assistant Examiner* — Taqi R Nasir
(74) *Attorney, Agent, or Firm* — J. Douglas Wells

(57) ABSTRACT

A multifunction testing and measuring device having a probe body with an elongated portion extending outward from a rearward main body portion to a hook-shaped forward end, the hook-shaped end useful for isolating a conductor under test, a slide closure member adapted to slide longitudinally forward from a rearward open position to a forward closed position, the closed position useful to capture the conductor under test within a space encircled by the combination of the hook-shaped end, the closed slide closure member, and the rearward main body, with the space encircled including a current sensing zone, and having test leads integral to and stowable on the main body. The multi tester comprises circuitry adapted for detecting a magnetic flux generated by an electric current passing through the conductor under test positioned within the current sensing zone, for sensing current and inrush current, as well as selectably measuring voltage, continuity, and resistance between the test leads.

20 Claims, 7 Drawing Sheets

(56) References Cited

U.S. PATENT DOCUMENTS

| | | | | |
|---|---|---|---|---|
| 5,481,185 A * | 1/1996 | Lane | ............... | G01R 1/04 |
| | | | | 324/115 |
| 5,610,512 A * | 3/1997 | Selcuk | ............... | G01R 1/04 |
| | | | | 324/127 |
| 6,043,640 A * | 3/2000 | Lauby | ............... | G01R 15/125 |
| | | | | 324/117 H |
| 6,812,685 B2 * | 11/2004 | Steber | ............... | G01R 1/06788 |
| | | | | 324/115 |
| 7,034,517 B2 * | 4/2006 | Newcombe | ............... | G01R 15/005 |
| | | | | 324/115 |
| 7,184,899 B2 * | 2/2007 | Cruz | ............... | G01R 15/125 |
| | | | | 702/57 |
| 7,400,133 B2 * | 7/2008 | Hollander | ............... | G01D 7/12 |
| | | | | 324/157 |
| 9,121,870 B2 * | 9/2015 | Nguyen | ............... | G01R 1/203 |
| 2007/0252578 A1 * | 11/2007 | Luo | ............... | G01R 1/22 |
| | | | | 324/126 |
| 2013/0032983 A1 | 2/2013 | Liu | | |
| 2013/0033253 A1 | 2/2013 | Liu | | |
| 2016/0356818 A1 | 12/2016 | Gopfert et al. | | |

\* cited by examiner

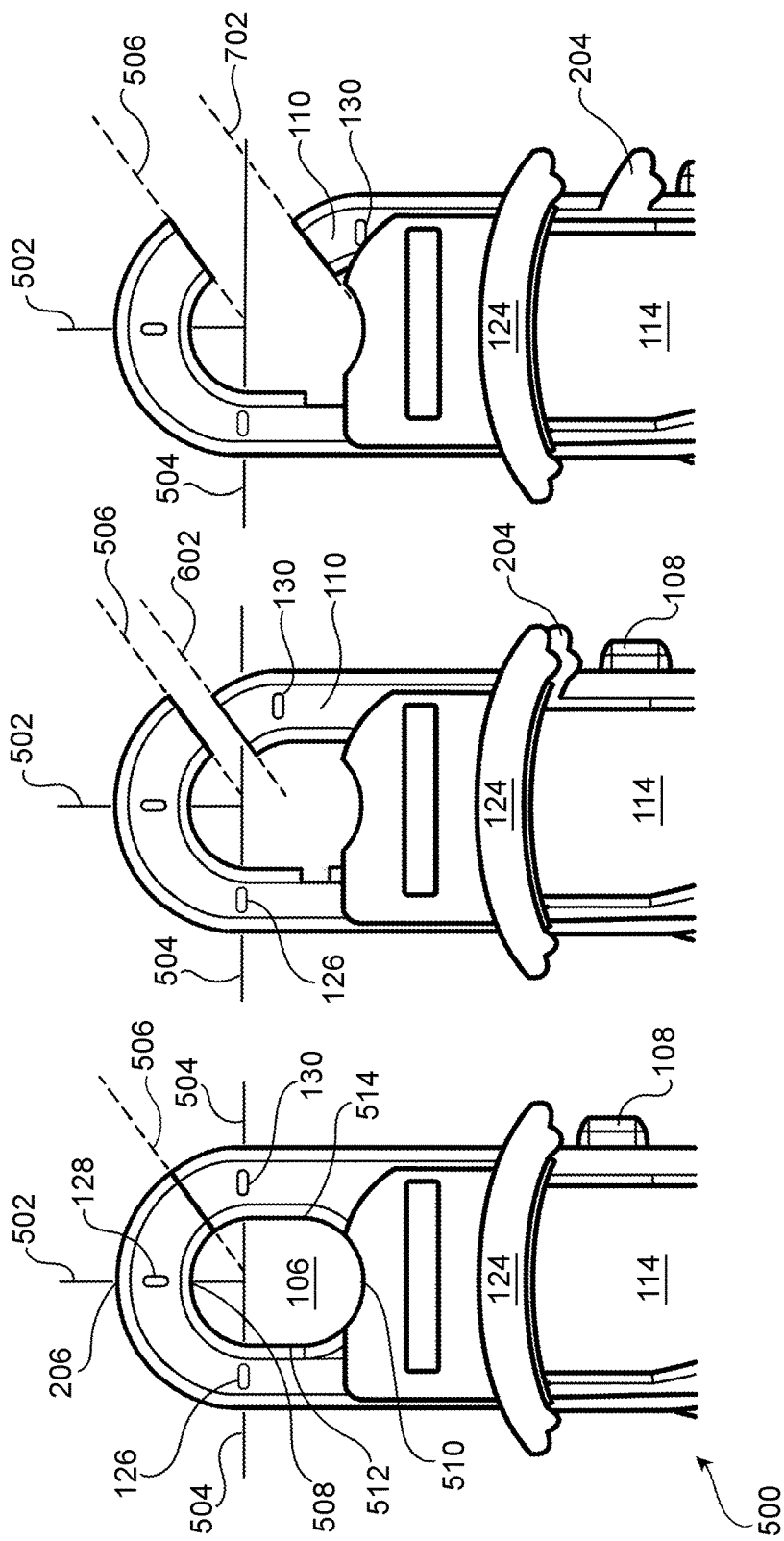

SLIDE CLOSURE MULTI TESTER

CROSS-REFERENCE TO RELATED APPLICATIONS

This is a continuation-in-part of patent application Ser. No. 15/044,093 filed Feb. 15, 2016, entitled SLIDE CLOSURE CURRENT TESTER, and now issued as U.S. Pat. No. 9,791,479.

BACKGROUND OF THE INVENTION

The technical field of invention relates to a multi-test/current measuring device for measuring an electric current running through a conductor, testing continuity, measuring voltage, measuring inrush current, and measuring resistance. More particularly, the present invention pertains to a hand-held hook-ended slide closure electronic multi tester/current measuring device for measuring an electric current running through a conductor by detecting the magnetic flux generated by the electric current, and measuring voltage, continuity, and resistance via integrated test leads.

Non-contact, non-interrupt current measuring and multi testing instruments are used in numerous applications where a conductor to be tested is live and cannot be electrically disrupted. Such applications are common, for example, in factory or office power distribution systems. Reliable and efficient means to measure current passing through an electrical conductor (or wire) without disconnecting the conductor or without direct electrical contact with the conductor have been attempted with varying degrees of success by different types of current measuring devices.

Perhaps the most common hand-held current measuring devices are of the clamp-on or hook-on type. Some brands of clamp-on current measuring devices are referred to as hook jaw type current measuring devices. All of these devices comprise a substantially circular clamping ring wherewithin a conductor may be positioned by opening a section of the hinged clamping ring, positioning the clamping ring around the conductor, and finally closing the clamping ring whereafter a current flowing through the conductor, typically an alternating current, may be measured. Such devices are available in a wide variety of sizes and with various sensitivities. However, clamp-on type current measuring devices incorporate hinged mechanisms for opening and closing a clamping ring (or core). Further, users of conventional clamp-on type current measuring devices have indicated that the hingeably open clamping ring is too large to fit around conductors when working in smaller spaces such as junction boxes, distribution panels, or similar electrical system enclosures. The conventional clamp-on type device requires the user to have enough space to hingeably open and then close the clamping ring around the conductor in order to make a current measurement.

U.S. Pat. No. 6,456,060 by Wiesemann and U.S. Pat. No. 5,349,289 by Shirai are each directed to hand-held clamp-on type current meters. Both include a side lever mechanism for hingeably opening one side (or jaw) of a clamping ring which, when depressed, allows for insertion of a conductor into an area enclosed by the clamping ring. Other clamp-on type devices, such as the clamp-on device disclosed in U.S. Pat. No. 5,610,512 by Selcuk, include a side lever mechanism that operates to hingeably open two hinged halves of a clamping ring. Yet another clamp-on type device, disclosed in U.S. Pat. No. 6,541,955 by Landre, uses a pliers type mechanism for hingeably opening two halves of a clamping ring. Each of these exemplary clamp-on type current measuring devices include a hinged clamping ring that is opened for insertion of a conductor to be tested and closed to allow for a current measurement.

An alternative to the clamp-on type current measuring device is a hand-held open fork type device that uses a C-shaped or horseshoe-shaped core wherewithin a conductor may be positioned for measuring an electric current passing through the conductor. U.S. Pat. No. 6,586,923 by Seike and U.S. Pat. No. 6,043,640 by Lauby et al. are each directed to hand-held open fork type current meters. Such open fork type devices require the user to either extend the device forward to position a conductor under test into the interior area within the C-shaped core or to bring the conductor rearward and into the interior area in order make a current measurement. Open fork type devices may be less bulky and easier to use in certain applications than the conventional clamp-on devices. However, open fork type devices are less accurate due to current leakage associated with what is effectively an open jaw when taking measurements, and open fork type devices still require undesirable manipulations in many routinely encountered situations.

For example, unlike the use of clamp-on type devices whereby a conductor under test may be isolated by closing the jaws or portions of the core (ring) around the conductor, thus affirmatively isolating the conductor, isolating a conductor with an open fork type device may require that the user reach with a free hand into the space occupied by the conductor in an effort to pull the conductor into the C-shaped core area so that a current measurement may be attempted. In typical applications, such manipulations may need to be repeated frequently, especially where several conductors are aggregated or bundled together in an electrical system access panel, junction box, distribution panel, or similar enclosure commonly used in wiring systems.

A novel and effective improvement is described in U.S. Pat. No. 7,327,133, filed May 4, 2006 and granted Feb. 5, 2008 (hereinafter, the '133 patent or, simply, '133), which is hereby incorporated by reference herein in its entirety. The '133 patent discloses a handheld-sized current measuring device including a probe body having an elongated portion extending outward to a hook-shaped end useful for isolating a conductor under test. However, the '133 device shares a disadvantage of open fork type devices—that is, the open end where the conductor under test is positioned for measuring current does not include structure or mechanisms for capturing the conductor.

What is needed is a current and multi test measuring device that provides a user with improved convenience and utility for various applications, especially for applications where the user may be required to work within tight spaces or spaces having several conductors bundled closely together. What is needed, therefore, is a different style of multi test/current measuring device.

The foregoing and other objectives, features, and advantages of the invention will be more readily understood upon consideration of the following detailed description of the invention taken in conjunction with the accompanying drawings.

BRIEF DESCRIPTION OF THE SEVERAL DRAWINGS

For a more complete understanding of the present invention, the drawings herein illustrate examples of the invention. The drawings, however, do not limit the scope of the invention. Similar references in the drawings indicate similar elements.

FIG. 5 illustrates a detail view of a forward end of the current measuring device in FIG. 1, according to one embodiment.

FIG. 6 illustrates the detail view of FIG. 5 with a slide closure member in a partially open position, according to one embodiment.

FIG. 7 illustrates the detail view of FIG. 5 with a slide closure member in a fully open position, according to one embodiment.

DETAILED DESCRIPTION OF PREFERRED EMBODIMENTS

In the following detailed description, numerous specific details are set forth in order to provide a thorough understanding of the preferred embodiments. However, those skilled in the art will understand that the present invention may be practiced without these specific details, that the present invention is not limited to the depicted embodiments, and that the present invention may be practiced in a variety of alternate embodiments. In other instances, well known methods, procedures, components, and systems have not been described in detail.

Preferred embodiments comprise a handheld-sized slide closure clamp multi test measuring device (i.e. multi tester) having an elongated portion extending outward from a rearward main body portion to a hook-shaped end, the hook-shaped end useful for isolating a conductor under test, a slide closure member adapted to slide longitudinally forward from a rearward open position to a forward closed position to capture the conductor under test within the space surrounded and encircled by the hook-shaped end and the closed slide closure member, and integrated test leads for measuring voltage, resistance, and continuity, the test leads preferably stowable on the main body portion of the device.

Figures 1, 2:
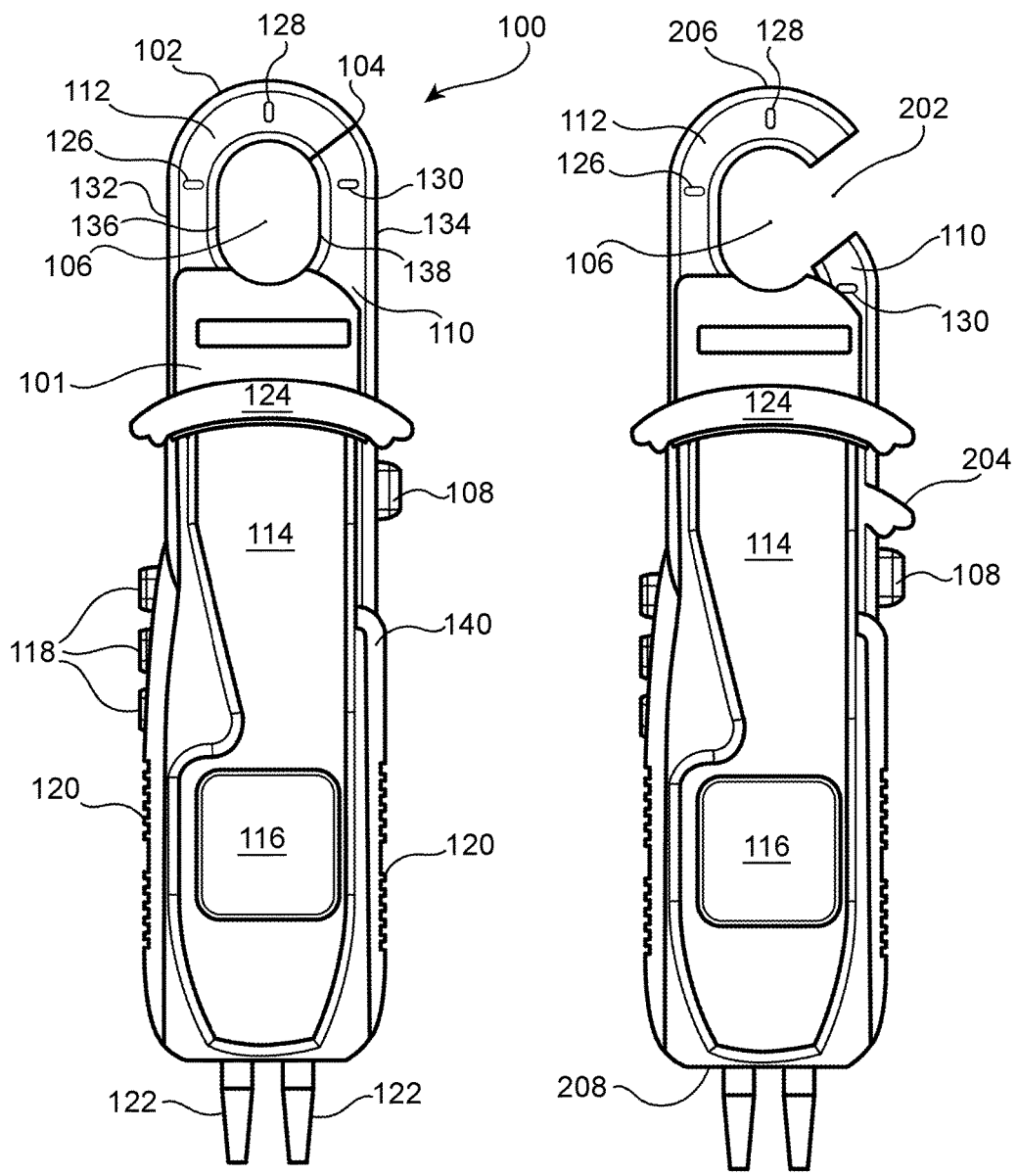
FIG. 1 illustrates a front view of a current measuring/muti testing device according to one embodiment of the invention.
FIG. 2 illustrates the front view in FIG. 1 with a slide closure member in a rearward open position, according to one embodiment of the invention.

FIGS. 1 and 2 illustrate front views 100 of a current measuring device 101, according to various embodiments. The current measuring device 101 shown comprises a handheld sized unit having a rearward main body portion 114, a probe portion extending forward of a forward grip feature 124 to a hook-shaped end 102, and a slide closure member 110, shown in FIG. 1 in a (forward-most) closed position. The slide closure member 110 preferably slidably extends forward toward a closure interface surface 104 on the hook-shaped end 102, and (longitudinally) rearward toward the rearward main body 114. Preferably the slide closure member 110 includes a release button 108 along its length, rearward of the forward grip feature 124 and forward of a main body slide closure receiving portion 140 where the rearmost portion of the slide closure member 110 hideably and securely slides into the main body 114 when the slide closure member 110 is moved from a closed position (shown in FIG. 1) to an open position (shown in FIG. 2). In one embodiment, as shown in FIG. 2, a side portion 204 of the forward grip feature 124 is affixed to the slide closure member 110 and, therefore, slides rearward with the release button 108 in relation to the main body 114.

FIGS. 1 and 2 illustrate the device 101 having an overall longitudinal length from a rearmost main body end 208 to a forwardmost end 206 of the hook-shaped end 102. A width of the forward probe area is shown between an outward side 132 of the hook-shaped end 102 and the oppositely orientated outward side 134 of the slide closure member 110. A width of the hook-shaped end 102 is illustrated as the width between the outward side 132 and oppositely oriented inward side 136. In preferred embodiments, and as shown in FIGS. 1 and 2, the width of the hook-shaped end 102 (between 132 and 136) is consistent throughout from where the hook-shaped end 102 extends forward to the interface surface 104. In preferred embodiments, the hook-shaped end 102 forms or takes on the shape of the letter "J" when viewing the device with the slide closure member 110 in an open position as in FIG. 2; and the combination of the hook-shaped end 102 and closed slide closure member 110 forms an upside down letter "U" as in FIG. 1, with structure of the main body 114 below (or rearward) the "U" shape enclosing the area/space 106.

The guidemarks 126 and 128 on the lower portion 112 of the "J" shaped hook portion and the guidemark 130 on the slide closure member 110, together provide reference for the user when opening the slide closure member 110 to allow insertion of a conductor under test through the opening 202 and into the space 106. The guide marks identify the optimum location for the conductor relative to the jaws or hook to get the most accurate measurement. The space 106 comprises a current sensing zone when the slide closure member 110 is in a closed postion. In its closed position, guidemarks 126 (on the "J" shaped hook portion 112) and 130 (on the slide closure member 110) are opposite one another and form a transverse reference that is perpendicular to a longitudinal axis or reference that runs through the guidemark 128 from the forwardmost end 206 to the rearmost end 208.

Also shown in FIG. 1 are various features, such as device control buttons 118, main body grip features 120, an electronic display 116, and test leads 122, any of which may be included according to various embodiments. Not shown, but preferably included in the current measuring device 101, is circuitry adapted for detecting a magnetic flux generated by an electric current passing through said conductor under test positioned within said current sensing zone. Such circuitry for this type of current measurement (by sensing magnetic flux in a conductor in a non-contact, non-interrupting, passive manner) is not described as any of a wide variety of methods may be used.

In preferred embodiments, the device 101 includes circuitry that turns on power for the device 101 when the slide closure member 110 is moved forward toward a closed position, and turns off power when the slide closure member 110 is moved rearward toward an open position, is novel with the present inventors design. In some embodiments, the device 101 includes circuitry adapted for energizing the device circuitry when said slide closure member is in a closed position and de-energizing the device circuitry when said slide closure member is in an open position. In one embodiment, the release button 108 serves as a switch to turn on the meter/tester/device 101 when the jaw/slide closure member 110 is opened.

Figures 3, 4:
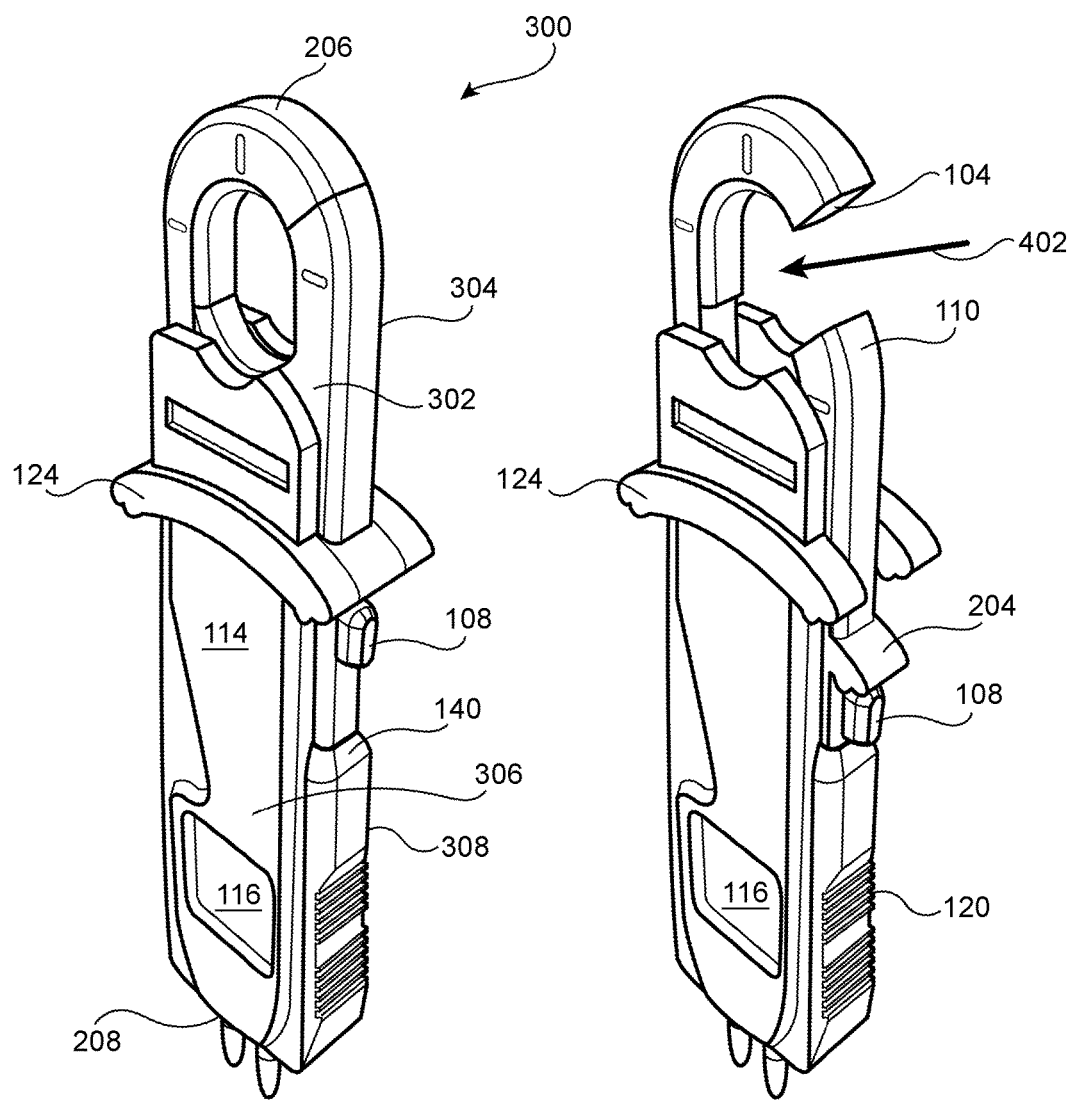
FIG. 3 illustrates a perspective view of FIG. 1, according to one embodiment of the invention.
FIG. 4 illustrates a perspective view of FIG. 2, according to one embodiment of the invention.

FIG. 3 illustrates a perspective view 300 of the current measuring device 101 shown in FIG. 1, according to various embodiments; and FIG. 4 illustrates a perspective view of FIG. 2, according to various embodiments. FIG. 3 shows the device 101 in a closed position, and FIG. 4 shows the device 101 in an open position. In preferred embodiments, a thickness of the slide closure member 110 is a thickness between front surface 302 and a rear surface (pointed to but not shown) 304. In the embodiment shown, the thickness 302-304 is consistent throughout the forwardmost portion of the slide closure member 110 and also the forwardmost portion of the "J" shaped (hook-shaped) end 112 and 102, as shown. Preferably, the rear main body 114 thickness is greater than 302-304 (the thickness of the forward portion of the slide closure member 110), which is shown as the thickness between front surface 306 and rear surface (pointed to but not shown) 308. The thicker rear main body 114 allows for improved ergonomics (for securely holding the device 101 in one hand), additional material and structure in the main body 114 in the receiver area 140 for receiving and securing the slide closure member 110, and (relatively) thinner/smaller dimensions for the forwardmost portions of the hook-end 102 (to make it easier to manipulate the hook-end 102 in tight areas such as circuit breaker panels, to isolate and capture a particular conductor for current measurement).

FIGS. 3 and 4 also show in greater detail how the slide closure member 110 moves in relation to the rest of the device. As the slide closure is moved rearward (downward in FIG. 4) a middle portion 204 of the forward grip feature 124 is affixed to the slide closure member 110, in preferred embodiments, and provides added ergonomic benefits when (for example) using a thumb to push forward the slide closure member 110 into a the closed position. Opening the slide closure member 110 provides for a path and motion 402 for inserting a conductor to be measured/tested into the current sensing zone in the space 106.

FIG. 5 illustrates a detail view 500 of a forward end of the current measuring device 101 in FIG. 1, according to various embodiments. FIG. 5 shows the slide closure member 110 in a closed position, enclosing a space 106 between inward surfaces 508 (inward surface of the hook-shaped end 102 opposite the device forwardmost end 206), 510 (inward surface of the rearward main body structure that effectively closes the "U" shaped combination of the "J" shaped/hook-shaped end 102 and the forward portion of the slide closure member 110), 512 (inward surface of the "J" shaped/hook-shaped end 102 proximate to the guidemark 126), and 514 (inward surface of the slide closure member 110 proximate to the guidemark 130). A transverse diameter of the space 106 is defined by the distance between 512 and 514 (transverse diameter 512-514) and a longitudinal diameter of the space 106 is defined by the distance between 508 and 510 (longitudinal diameter 508-510).

A longitudinal axis line 502 is shown running lengthwise along the device from, the forwardmost end 206 of the device, through the guidemark 128, and rearward (shown downward in FIG. 5). A transverse axis line 504 is shown running perpendicular to the longitudinal axis line 502, intersecting both the guidemarks 126 and 130 (when the slide closure member 110 is in a closed position). An interface line 506 is shown where the slide closure member 110 closes against the corresponding interface surface 104 of the hook-shaped end 102. In preferred embodiments, the angle between interface line 506 and the transverse line 504 (angle 506-to-504) is less than or equal to 45 degrees. In some embodiments that 504-to-506 angle may be lower, or down to zero degrees, where the interface surface 104 would effectively intersect/overlap with guidemark 130, or may be up to 90 degrees, in which case the interface surface 104 would effectively intersect/overlap with guidemark 128. In most preferred embodiments, the interface line 506 is approximately as shown in FIG. 5, with the angle 504-to-506 also approximately as shown. The angle 504-to-506 is preferably just under 45 degrees.

FIG. 6 illustrates the detail view of FIG. 5 with the slide closure member 110 in a partially open position, according to one embodiment. Slide closure member 110 reference line 602 shows the partial opening between the interface surface 104 (see FIG. 4) (along interface reference line 506) and the corresponding surface of the end of the slide closure member 110 that is opposite the interface surface 104 when the slide closure member 110 is closed. Reference lines 506 and 602 are preferably parallel, and the distance between them represent the amount of opening through which a conductor to be tested (i.e. a conductor under test) may be inserted into the space 106.

Likewise, FIG. 7 illustrates the detail view of FIG. 5 with the slide closure member 110 in a fully open position, according to one embodiment. Slide closure member 110 reference line 702 shows the full opening between the interface surface 104 (along interface reference line 506) and the corresponding surface of the end of the slide closure member 110 that is opposite the interface surface 104 when the slide closure member 110 is closed. Reference lines 506 and 702 are preferably parallel, and the distance between them represent the full amount of opening through which a conductor under test may be inserted into the space 106.

In operation, a preferred method for measuring current using the current measuring device 101 includes the steps of manipulating the hook-shaped end 102 of the probe body 112 to isolate a conductor under test to within a current sensing zone in the space 106 so that the conductor passes through the open slide closure (as shown by motion 402 in FIG. 4), sliding the slide closure member 110 longitudinally forward from said rearward open position to its forward closed position (as shown in FIG. 3), and detecting magnetic flux generated by electric current passing through the conductor under test that is positioned within the current sensing zone in the space 106 encircled by the "J" shaped end 102, the forward end of the slide closure member 110, and the main body structure rearward of the "J" shaped end 102 and forward portion of the slide closure member 110. Preferably moving the slide closure member 102 forward toward a closed position turns the device on and moving it rearward toward an open position turns the device 101 off. Most preferably, the device circuitry is energized when the slide closure member 110 is in a closed position, so that the device is activated and takes current measurements for a conductor within the current sensing zone in the enclosed space 106; and the device circuitry is de-energized when the slide member 110 is in an open position, so that the device is de-activated to conserve internal device battery power.

Figure 8:
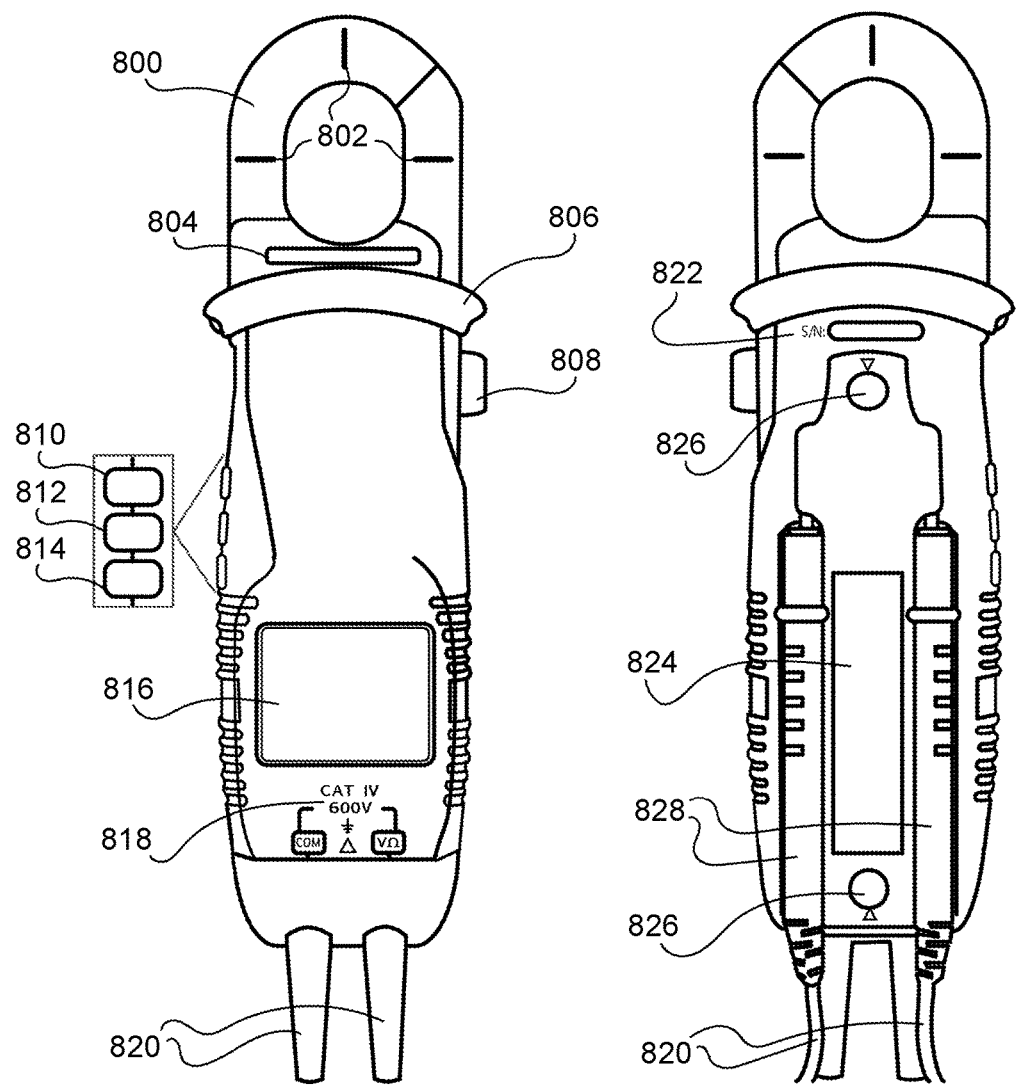
FIG. 8 illustrates front and back views of a multi tester embodiment, with its slide closure member in a closed position and a pair of test leads in a stowed position on the main body of the device.

FIG. 8 illustrates front and back views of a multi tester embodiment, with its slide closure member in a closed position and a pair of test leads 820 in a stowed position on the main body of the device. The multi tester shown in FIG. 8 preferably comprises the features/capabilities/circuitry: voltage testing/measurement to 600V AC/DC; current testing/measurement to 200 A AC; resistance testing/measurement to 2000Ω; continuity testing with audible indication; LRA inrush current testing/measurement; a sliding clamp closure conductor capturing structure and mechanical operation; functions for auto hold and auto ranging when making measurements; display with backlight for improved viewing in low light as well as bright light situations; a low battery indicator; automatic power off; integral permanent test leads with stowage on the main body of the multi tester device; easy to open and close/secure latches for the device battery compartment; and auto-on functionality (actuated with closure of the slide closing clamp mechanism).

General specifications of the multi tester shown in FIG. 8 comprise: Operating Temperature: 32° to 104° F. (0° to 40° C.); Storage Temperature 14° to 122° F. (−10° to 50° C.); Operating Humidity: <75%; Operating Altitude: 6,562 ft (2,000 m); Pollution Degree: 2; Display: 3½" 2000 count; Backlight: Yes; Refresh Rate: 3/sec; Over-range: "OL" is displayed; Dimensions: 8.66"×2.72"×1.56"; Item Weight: 12 oz; Calibration: Recommended annually; CAT Rating: CATIV 600V; Certifications: cETLus 3rd Edition, CATIV 600V, CE Conformity, IP41, RoHS Compliant, 6' Drop Protection, IEC 61010-1 3rd Edition; Battery Type: 1.5V (AAA) X 2; Accuracy: ±(% of reading +# of least significant digits).

As shown in FIG. 8, the multi tester preferably comprises the following features and capabilities:

Clamp 800: Measure inductive AC current. Opens to 0.76" (19.10 mm).

Conductor Alignment Marks 802: Used to aid the visual alignment of a conductor when measuring inductive amperage. Greatest accuracy is achieved when the conductor inside the clamp is centered at the intersection of these marks.

Category Max Indicator 804: Maximum CAT Rating for Clamp.

Hand Guide 806: Used as a point of reference for the operator's safety.

Clamp Lever 808: Opens and closes current clamp. Do not allow fingers or objects to become pinched in the clamp as it closes. When sliding the clamp lever, be careful not to inadvertently press any button when gripping the meter. That may place the meter in a mode that was not desired.

A-Hold/LRA Inrush Button 810: Auto-Hold: Press to enable Auto-Hold. Press again to return to live readings. Captures present value displayed. When a new stable value is detected, with more than 5% difference than displayed value, the meter displays the new value. Press and hold the A-Hold button when meter is in Auto-Hold mode to disable Auto power off mode. Press and hold again to enable Auto power off mode. When the meter is in Auto-Hold mode, there will be an audible beep while the meter captures a new, stable value. LRA Inrush: Press and hold to enable LRA Inrush mode. Press and hold to return to live readings. Used for measuring compressor motor start current. When powering on the meter using this button, the meter will default to last mode used when meter was powered off.

Ohms/Continuity/Backlight Button 812: Ohms: Press to enter Ohms measurement mode. Continuity: Press again to enter Continuity measurement mode. AC Amps: Press again to enter AC Amps measurement mode. Backlight: Press and hold to turn on backlight. Press and hold again to turn off backlight. Backlight duration is 1 minute.

AC/DC Volts/Power Button 814: AC Volts: Press to enter AC Volts measurement mode. DC Volts: Press again to enter DC Volts measurement mode. AC Amps: Press again to enter AC Amps measurement mode. Press and hold to power off meter.

Display 816: High contrast backlit display.

Category Max Indicator 818: Maximum CAT Rating for test lead connections to meter. NOTE: Please see Test Lead Notes section of this manual for specific CAT Rating of the test leads.

Test Leads 820: Permanent test leads. Multifunction test lead used for measuring: AC or DC volts, resistance and continuity.

Serial Number 822.

Battery Cover 824: Easy access for replacing batteries.

Battery Cover Latches 826: Convenient, quick opening.

Test Lead Holders 828: For storing test leads when not in use.

Figure 9:
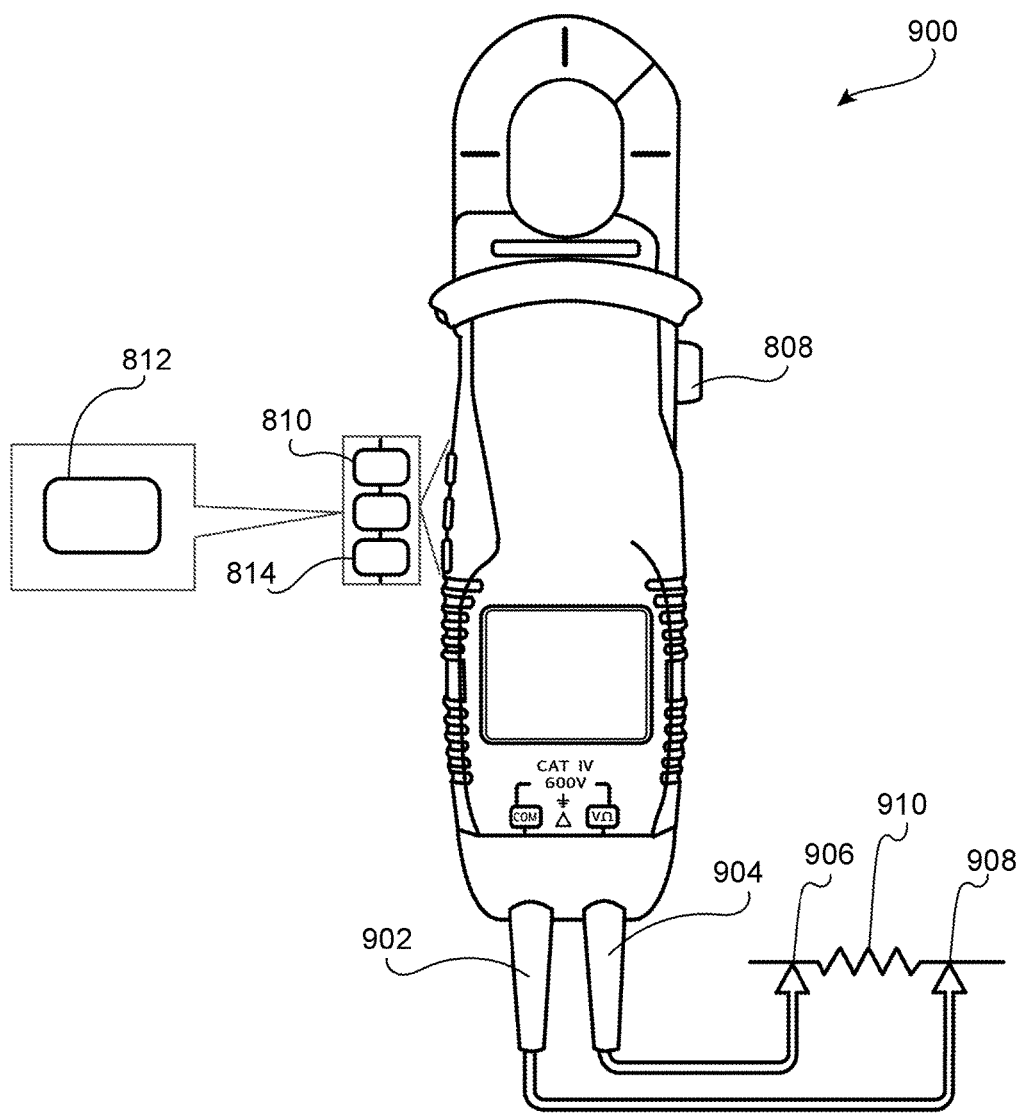
FIG. 9 illustrates the multi tester of FIG. 8 diagrammatically oriented for testing resistance or continuity.

FIG. 9 illustrates the multi tester of FIG. 8 diagrammatically oriented 900 for testing resistance or continuity. Test leads 902 and 904 are shown contacting conductors at 908 and 906, respectively, for testing (as shown) resistance of the component 910. Continuity of a component may similarly be checked. And in similar fashion, voltage drop between two contact points in a circuit may be measured.

Figure 10:
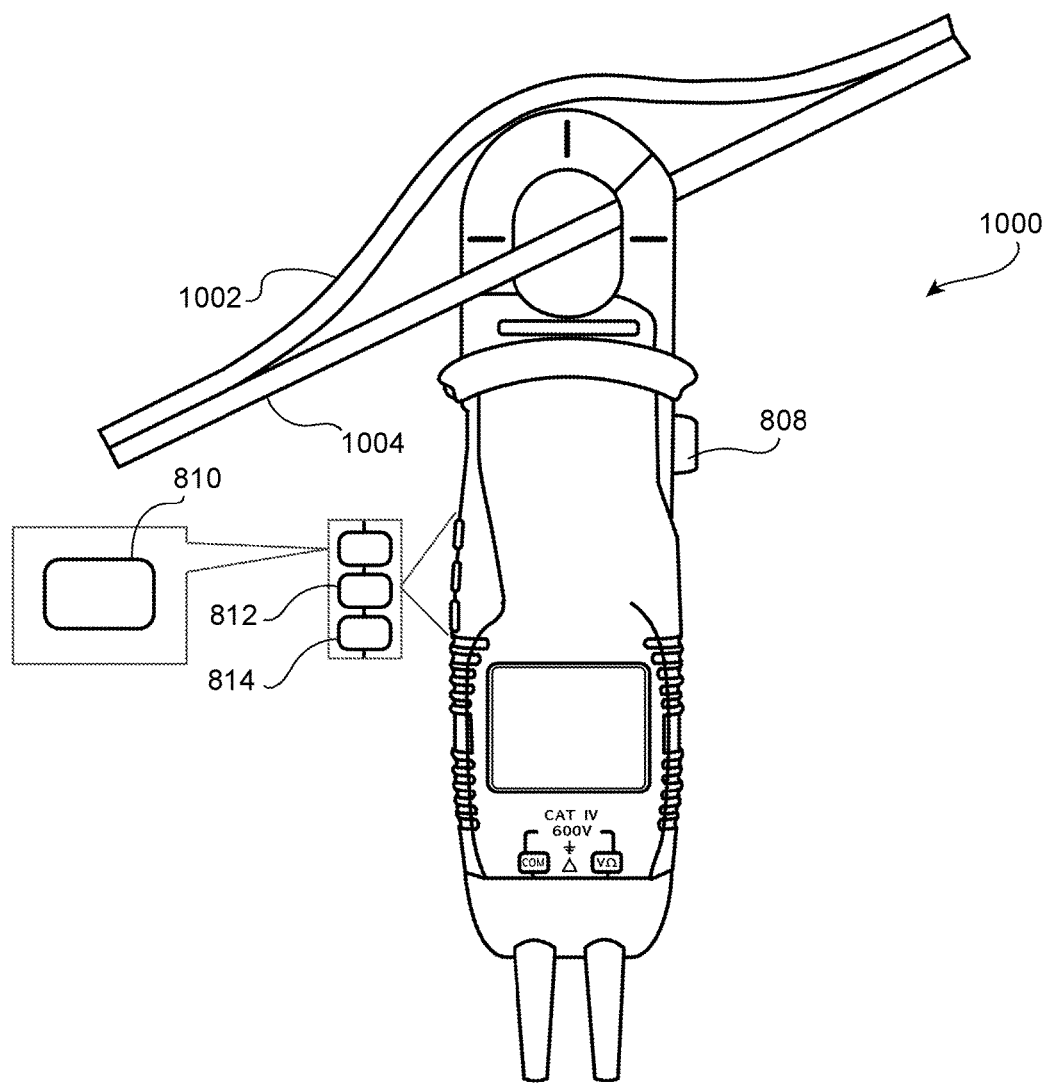
FIG. 10 illustrates the multi tester of FIG. 8 oriented for testing inrush current.

FIG. 10 illustrates the multi tester of FIG. 8 oriented 1000 for testing inrush current on a singled (isolated) conductor 1004. Other conductors such as conductor 1002 is preferably kept outside of the current sensing region of the clamp meter.

Figure 11:
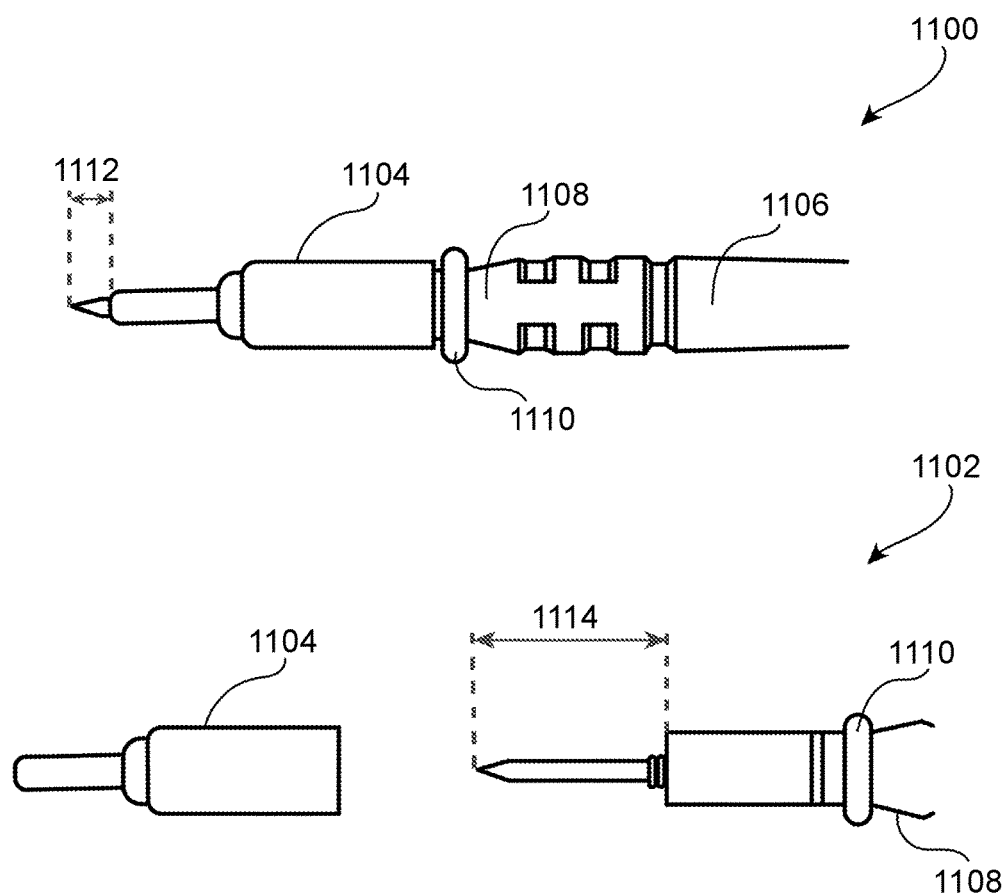
FIG. 11 illustrates details of exemplary test leads integral to the multi tester of FIG. 8.

FIG. 11 illustrates details of exemplary test leads integral to the multi tester of FIG. 8. Test lead 1100 is shown with its shield 1104 in place, for CAT IV measurements, exposing only a small portion (4 mm) of the test lead tip 1112. Test lead 1102 is shown with the shield 1104 pulled away from the collar 1110, neck 1108, and remainder of the test lead body 1106, exposing a larger (18 mm) test lead tip 1114 for CAT II measurements, and suitable for testing recessed conductors such as standard wall outlets.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A multifunction testing and measuring device comprising: (a) a probe body having an elongated portion extending outward from a rearward main body portion of said device to a hook-shaped end, said hook-shaped end useful for isolating a conductor under test; (b) a slide closure member adapted to slide longitudinally forward from a rearward open position to a forward closed position, said closed position useful to capture said conductor under test within a space encircled by a combination of said hook-shaped end, said closed slide closure member, and said rearward main body, said space encircled by said combination of said hook-shaped end and said closed slide closure member comprising a current sensing zone; (c) a side portion affixed to said slide closure member and extending from said main body, said side portion longitudinally movable to slide forward to move said slide closure member toward said closed position and to slide rearward to move said slide closure member toward said open position; (d) circuitry adapted for detecting a magnetic flux generated by an electric current passing through said conductor under test positioned within said current sensing zone; and (e) a pair of test leads and circuitry adapted for measuring at least one of a voltage, continuity, and resistance between each test lead of said pair of test leads.

2. The device of claim 1 wherein said test leads are integral to and stowable on said rearward main body.

3. The device of claim 1 wherein said circuitry adapted for measuring at least one of voltage, continuity, and resistance between each test lead of said pair of test leads includes circuitry adapted for selectably measuring voltage, continuity, and resistance between each test lead of said pair of test leads.

4. The device of claim 1 further comprising circuitry adapted for measuring LRA inrush current.

5. The device of claim 1 further comprising a release button affixed to said side portion, said release button adapted to permit longitudinal movement of said slide closure member.

6. The device of claim 1 further comprising circuitry adapted for turning on power for said device when said slide closure member is moved forward toward said closed position and adapted for turning off power for said device when said slide closure member is moved rearward toward said open position.

7. A method of measuring at least one of a current, voltage, continuity, and resistance using a multifunction testing and measuring device, the multifunction testing and measuring device comprising a probe body having an elongated portion extending outward from a rearward main body portion of said device to a hook-shaped end, said hook-shaped end useful for isolating a conductor under test, a slide closure member adapted to slide longitudinally forward from a rearward open position to a forward closed position, said closed position useful to capture said conductor under test within a space encircled by a combination of said hook-shaped end, said closed slide closure member, and said rearward main body, said space encircled by said combination of said hook-shaped end and said closed slide closure member comprising a current sensing zone, circuitry adapted for detecting a magnetic flux generated by an electric current passing through said conductor under test positioned within said current sensing zone, a longitudinally movable side portion affixed to said slide closure member and extending from said main body, and a pair of test leads and circuitry adapted for measuring at least one of voltage, continuity, and resistance between each test lead of said pair of test leads, the method comprising: (a) manipulating said hook-shaped end of said probe body to isolate said conductor under test within said current sensing zone; (b) sliding said slide closure member longitudinally forward from said rearward open position to said forward closed position by longitudinally moving said side portion from a rearward position to a forward position; and (c) detecting magnetic flux generated by electric current passing through said conductor under test positioned within said current sensing zone.

8. The method of claim 7 further comprising measuring at least one of a voltage, continuity, and resistance between each test lead of said pair of test leads.

9. The method of claim 8 further comprising stowing each of said test leads on said rearward main body portion of said device.

10. The method of claim 7 further comprising measuring LRA inrush current in said conductor under test within said current sensing zone.

11. The method of claim 10 wherein measuring LRA inrush current comprises the steps of: (a) placing said device in an operational mode for real-time measurements of AC current passing through said conductor under test positioned within said current sensing zone; (b) placing said device in an operational mode for measuring LRA inrush current; (c) activating a compressor associated with said conductor under test; and (d) reading a value displayed representing the starting current for said compressor.

12. The method of claim 11 further comprising returning said device to said operational mode for live measurements of AC current passing through said conductor under test positioned within said current sensing zone.

13. The method of claim 7 further comprising turning on power for said device by moving said slide closure member forward toward said closed position and turning off power for said device by moving said slide closure member rearward toward said open position.

14. A multifunction testing and measuring device comprising: (a) a probe body having an elongated portion extending outward from a rearward main body portion of said device to a hook-shaped end, said hook-shaped end useful for isolating a conductor under test; (b) a slide closure member adapted to slide longitudinally forward from a rearward open position to a forward closed position, said closed position useful to capture said conductor under test within a space encircled by a combination of said hook-shaped end, said closed slide closure member, and said rearward main body, said space encircled by said combination of said hook-shaped end and said closed slide closure member comprising a current sensing zone; (c) a side portion affixed to said slide closure member and extending from said main body, said side portion longitudinally movable to slide forward to move said slide closure member toward said closed position and to slide rearward to move said slide closure member toward said open position; (d) circuitry adapted for detecting a magnetic flux generated by an electric current passing through said conductor under test positioned within said current sensing zone, said device thereby adapted for measuring said current passing through said conductor without requiring physical contact with said conductor; and (e) circuitry adapted for measuring voltage, continuity, and resistance between a pair of test leads.

15. The device of claim 14 wherein said test leads are integral to and stowable on said rearward main body.

16. The device of claim 14 further comprising circuitry adapted for measuring LRA inrush current.

17. The device of claim 14 wherein said hook-shaped end comprises a "J" shaped end.

18. The method of claim 7 further comprising depressing a release button affixed to said side portion, said release button adapted to permit longitudinal movement of said slide closure member.

19. The device of claim 14 further comprising a release button affixed to said side portion, said release button adapted to permit longitudinal movement of said slide closure member.

20. The device of claim 14 further comprising circuitry adapted for turning on power for said device when said slide closure member is moved forward toward said closed position and adapted for turning off power for said device when said slide closure member is moved rearward toward said open position.

* * * * *